(12) United States Patent
Dorsett

(10) Patent No.: US 7,211,743 B1
(45) Date of Patent: May 1, 2007

(54) APPARATUS FOR SUPPORTING PRINTED WIRING ASSEMBLIES IN A DEVICE HOUSING

(75) Inventor: Jeff L. Dorsett, Ramona, CA (US)

(73) Assignee: General Instrument Corporation, Horsham, PA (US)

( * ) Notice: Subject to any disclaimer, the term of this patent is extended or adjusted under 35 U.S.C. 154(b) by 0 days.

(21) Appl. No.: 11/302,778

(22) Filed: Dec. 14, 2005

(51) Int. Cl.
*H05K 7/14* (2006.01)

(52) U.S. Cl. .................. 174/545; 361/759; 361/752; 361/801; 361/796; 174/138 G

(58) Field of Classification Search ............ 174/138 G, 174/535, 545; 361/752, 759, 801, 796
See application file for complete search history.

(56) References Cited

U.S. PATENT DOCUMENTS

| | | | | |
|---|---|---|---|---|
| 5,499,163 | A * | 3/1996 | Sonntag et al. ............. | 361/759 |
| 6,295,210 | B1 * | 9/2001 | Lanzone et al. ............ | 361/799 |
| 6,424,537 | B1 * | 7/2002 | Paquin et al. ............... | 361/752 |
| 6,486,406 | B1 * | 11/2002 | Greco et al. ............ | 174/138 R |
| 6,741,460 | B2 * | 5/2004 | Huang ........................ | 361/683 |
| 6,785,146 | B2 * | 8/2004 | Koike et al. ................ | 361/759 |
| 6,816,384 | B2 * | 11/2004 | Wu et al. .................... | 361/759 |
| 6,864,573 | B2 * | 3/2005 | Robertson ................... | 257/718 |
| 7,040,905 | B1 * | 5/2006 | Wang ........................ | 439/76.1 |
| 2001/0028555 | A1 * | 10/2001 | Takeuchi .................... | 361/752 |
| 2006/0104040 | A1 * | 5/2006 | Hsu ............................ | 361/752 |
| 2006/0114662 | A1 * | 6/2006 | Liu et al. .................... | 361/759 |
| 2006/0232948 | A1 * | 10/2006 | Haager et al. .............. | 361/752 |

\* cited by examiner

*Primary Examiner*—Hung V. Ngo
(74) *Attorney, Agent, or Firm*—Larry T. Cullen

(57) ABSTRACT

Apparatus for supporting printed wiring assemblies (PWAs) in a device housing is described. In one example, a frame is provided having first opposing sides, second opposing sides, a top side, and a bottom side. A lateral member extends between the second opposing sides and includes a plurality of inner clips proximate the bottom side. One of the first opposing sides includes a first plurality of outer clips proximate the bottom side. Another of the first opposing sides includes a second plurality of outer clips proximate the bottom side. The first opposing sides may also include a third plurality of outer clips proximate the top side. In this manner, the frame bottom side includes mounting sites for first and second PWAs. The frame top side includes a mounting site for a third PWA. The PWAs can be secured in the frame without the need for fasteners.

20 Claims, 4 Drawing Sheets

APPARATUS FOR SUPPORTING PRINTED WIRING ASSEMBLIES IN A DEVICE HOUSING

BACKGROUND OF THE INVENTION

1. Field of the Invention

The present invention relates to mechanical supports for electronic devices and, more particularly, to an apparatus for supporting printed wiring assemblies in a device housing.

2. Description of the Background Art

Electronic devices typically include a housing that encloses one or more printed wiring assemblies, such as circuit boards. The printed wiring assemblies include various types of electronic components and connectors coupled together to perform the function of the device. The printed wiring assemblies are conventionally secured within the housing using various fasteners, such as screws. During manufacture of such a device, the tools are required to install the printed wiring assemblies within the housing. In an assembly line production, the use of tools to secure the printed wiring assemblies consumes a significant amount of time and increases costs. Accordingly, there exists a need in the art for an apparatus for supporting printed wiring assemblies that does not employ fasteners to secure the printed wiring assemblies within the device housing.

SUMMARY OF THE INVENTION

Apparatus for supporting printed wiring assemblies (PWAs) in a device housing is described. In one embodiment, a frame is provided having first opposing sides, second opposing sides, a top side, and a bottom side. A lateral member extends between the second opposing sides. The lateral member includes a plurality of inner clips proximate the bottom side of the frame. One of the first opposing sides includes a first plurality of outer clips proximate the bottom side of the frame. Another of the first opposing sides includes a second plurality of outer clips proximate the bottom side of the frame. The first opposing sides may also include a third plurality of outer clips proximate the top side of the frame. In this manner, the bottom side of the frame includes mounting sites for first and second PWAs. The top side of the frame includes a mounting site for a third PWA. The PWAs can be secured in the frame without the need for fasteners.

BRIEF DESCRIPTION OF DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures.

DETAILED DESCRIPTION OF THE INVENTION

Figure 1:
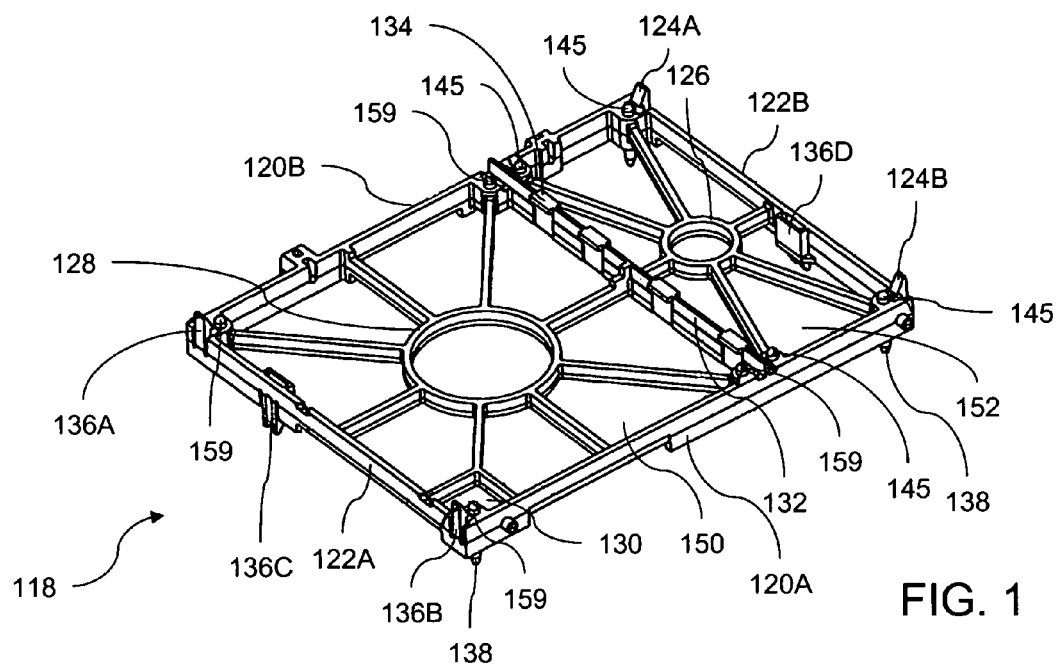
FIG. 1 is a perspective view showing an exemplary embodiment of a support structure for supporting printed wiring assemblies (PWAs) within a housing in accordance with one or more aspects of the invention.

FIG. 1 is a perspective view showing an exemplary embodiment of a support structure 118 for supporting printed wiring assemblies (PWAs) within a housing in accordance with one or more aspects of the invention. The support structure 118 includes first opposing sides 120A and 120B (collectively sides 120) and second opposing sides 122A and 122B (collectively sides 122). The sides 120 and 122 collectively form a frame of the support structure 118. The frame defines a top and bottom sides of the support structure 118. The support structure 118 is shown bottom-side up in FIG. 1. A lateral member 132 extends between the sides 120. The lateral member 132 divides the top side of the support structure 118 into two mounting sites 150 and 152. As described below, the mounting sites 150 and 152 are configured to support two PWAs. The lateral member 132 is positioned such that the mounting sites 150 and 152 are sized to support the corresponding PWAs.

The mounting site 150 includes a support element 128, and the mounting site 152 includes a support element 126. In the pictured embodiment, the support element 128 comprises a circular portion and a plurality of lateral supports radially extending therefrom and joining with the sides 120, the side 122A, and the lateral member 132. The support element 126 comprises a circular portion and a plurality of lateral supports radially extending therefrom and joining with the sides 120, the side 122B, and the lateral member 132. As described below, the support members 126 and 128 are configured to support PWAs within the mounting sites 152 and 150, respectively. The support members 126 and 128 also provide support for the frame. While a specific structure for each of the support members 126 and 128 is shown and described, those skilled in the art will appreciate that the support members 126 and 128 may comprise other structures.

The support structure 118 provides a mounting system for three PWAs for support within a housing. The PWAs may comprise, for example, circuit boards having various types of circuit elements and electrical connectors. The support structure 118 is configured such that no mounting hardware (e.g., screws or other types of fasteners) is required to secure the PWAs. The support structure 118 may comprise plastic formed members using a conventional injection molding process. The PWAs may be installed within the support structure 118 without tools. In one embodiment, the support structure 118 supports a main PWA, a power supply PWA, and a battery charging and monitoring PWA for a VoIP cable modem. Those skilled in the art will appreciate that the support structure 118 may be used to support other types of PWAs within a housing for other types of devices.

Figure 2:
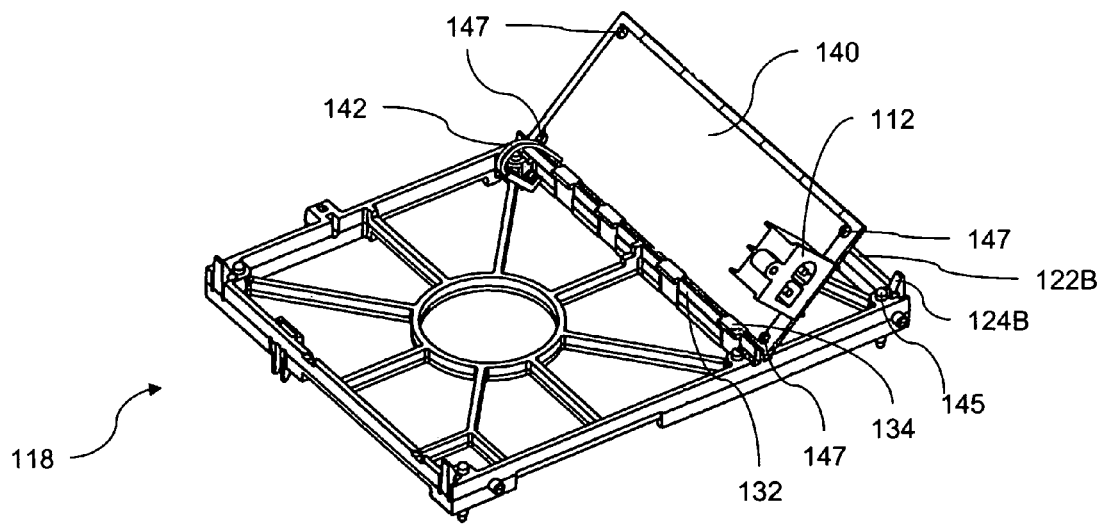
FIG. 2 is a perspective view illustrating installation of a first PWA onto the support structure of FIG. 1 in accordance with one or more aspects of the invention.

FIG. 2 is a perspective view illustrating installation of a first PWA 140 onto the support structure 118 in accordance with one or more aspects of the invention. For clarity, reference characters for elements of the support structure 118 that are not associated with the PWA 140 are omitted. The PWA 140 includes mounting holes 147 (e.g., four are shown). The support structure 118 includes mounting posts 145. The mounting holes 147 are configured to be registered with the mounting posts 145 such that the PWA 140 is supported within the mounting site 152. To install, the PWA 140 is tilted such that an edge thereof is secured under inner clips 134 on the lateral member 132. In one embodiment, the inner clips 134 comprise fixed retention clips. The support structure 118 is shown as having four inner clips 134, although more or less may be used.

The PWA 140 is lowered into position such that the mounting holes 147 are registered with the mounting posts 145. The edge of the PWA 140 opposite the edge secured by the inner clips 134 is secured under outer clips 124A and 124B (collectively outer clips 124) on the side 122B. In one embodiment, the outer clips 124 comprise flexible retention clips having a sloped or inclined face upon which the PWA 140 is pressed when mounted. Such pressing causes the outer clips 124 to flex to allow mounting. Once the PWA 140 is pressed into a level below the inclined face, the outer clips 124 spring back to the original positions and, together with the inner clips 134, lock the PWA 140 in position in the mounting site 152. The support structure 118 is shown as having two outer clips 124, although more may be provided. The PWA 140 is supported by the support member 126.

Figure 3:
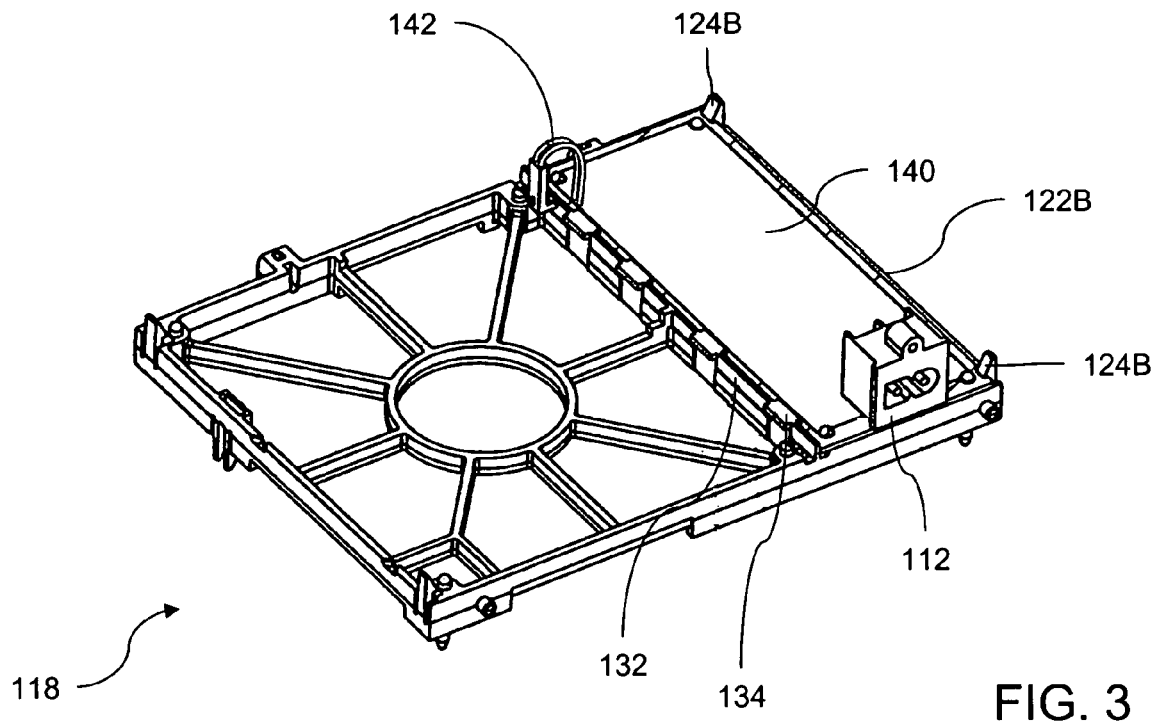
FIG. 3 is a perspective view of the PWA of FIG. 2 installed onto the support structure of FIG. 1.

FIG. 3 is a perspective view of the PWA 140 installed onto the support structure 118. As shown, the PWA 140 is retained within the mounting site 152 by the outer clips 124 and the inner clips 134. Notably, the PWA 140 is secured to the support structure 118 without fasteners, such as screws. In one embodiment, the PWA 140 comprises a power supply PWA for a device, such as a VoIP cable modem. The PWA 140 illustratively includes a power socket 112 and a jumper assembly 142. It is to be understood that the PWA 140 may comprise other types of PWAs having other types of components.

Figure 4:
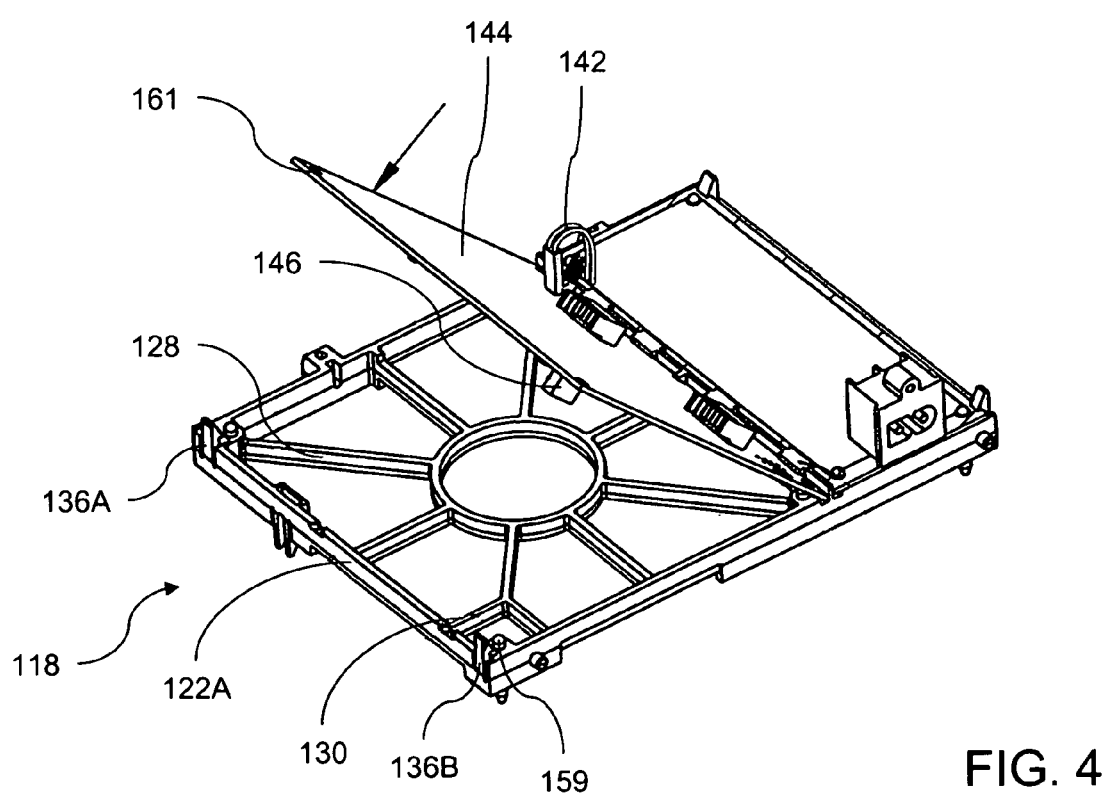
FIG. 4 is a perspective view illustrating installation of a second PWA onto the support structure of FIG. 1 in accordance with one or more aspects of the invention.

FIG. 4 is a perspective view illustrating installation of a second PWA 144 onto the support structure 118 in accordance with one or more aspects of the invention. For clarity, reference characters for elements of the support structure 118 that are not associated with the PWA 144 are omitted. The PWA 144 includes mounting holes 161 (e.g., four are shown). The support structure 118 includes mounting posts 159. The mounting holes 161 are configured to be registered with the mounting posts 159 such that the PWA 144 is supported within the mounting site 150. To install, the PWA 144 is tilted such that an edge thereof is secured under inner clips 134 on the lateral member 132.

The PWA 144 is lowered into position such that the mounting holes 161 are registered with the mounting posts 159. The edge of the PWA 144 opposite the edge secured by the inner clips 134 is secured under outer clips 136A, 136B, 136C and 136D (collectively outer clips 136) on the side 122A. In one embodiment, the outer clips 136 comprise flexible retention clips having a sloped or inclined face upon which the PWA 144 is pressed when mounted. Such pressing causes the outer clips 136 to flex to allow mounting. Once the PWA 144 is pressed into a level below the inclined face, the outer clips 136 spring back to the original positions and, together with the inner clips 134, lock the PWA 144 in position in the mounting site 150. The support structure 118 is shown as having two outer clips 136, although more may be provided. The PWA 144 is supported by the support member 128.

Figure 5:
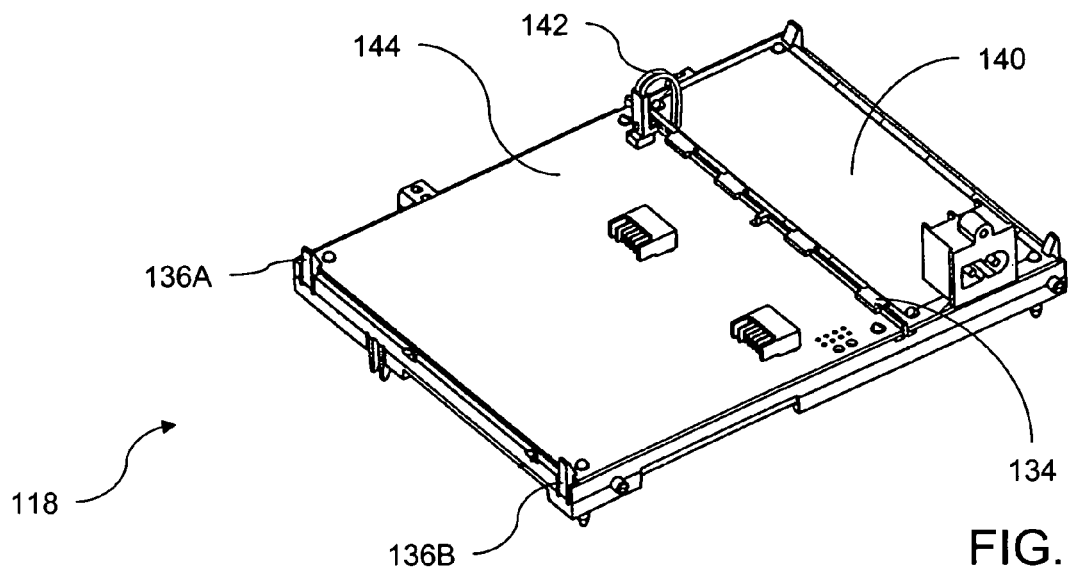
FIG. 5 is a perspective view of the PWA of FIG. 4 installed onto the support structure of FIG. 1.

FIG. 5 is a perspective view of the PWA 144 installed onto the support structure 118. As shown, the PWA 144 is retained within the mounting site 150 by the outer clips 136 and the inner clips 134. Notably, the PWA 144 is secured to the support structure 118 without fasteners, such as screws. In one embodiment, the PWA 144 comprises a battery charging and monitoring PWA for a device, such as a VoIP cable modem. The PWA 144 includes a connector 146. The connector 146 may comprise any type of electrical connector known in the art. When the PWA 144 is installed onto the support structure 118, the connector 146 is disposed in an area 130 defined by the support member 128. The connector 146 is thus exposed to the top side of the support structure 118. It is to be understood that the PWA 144 may comprise other types of PWAs for performing other types of functions.

Figure 6:
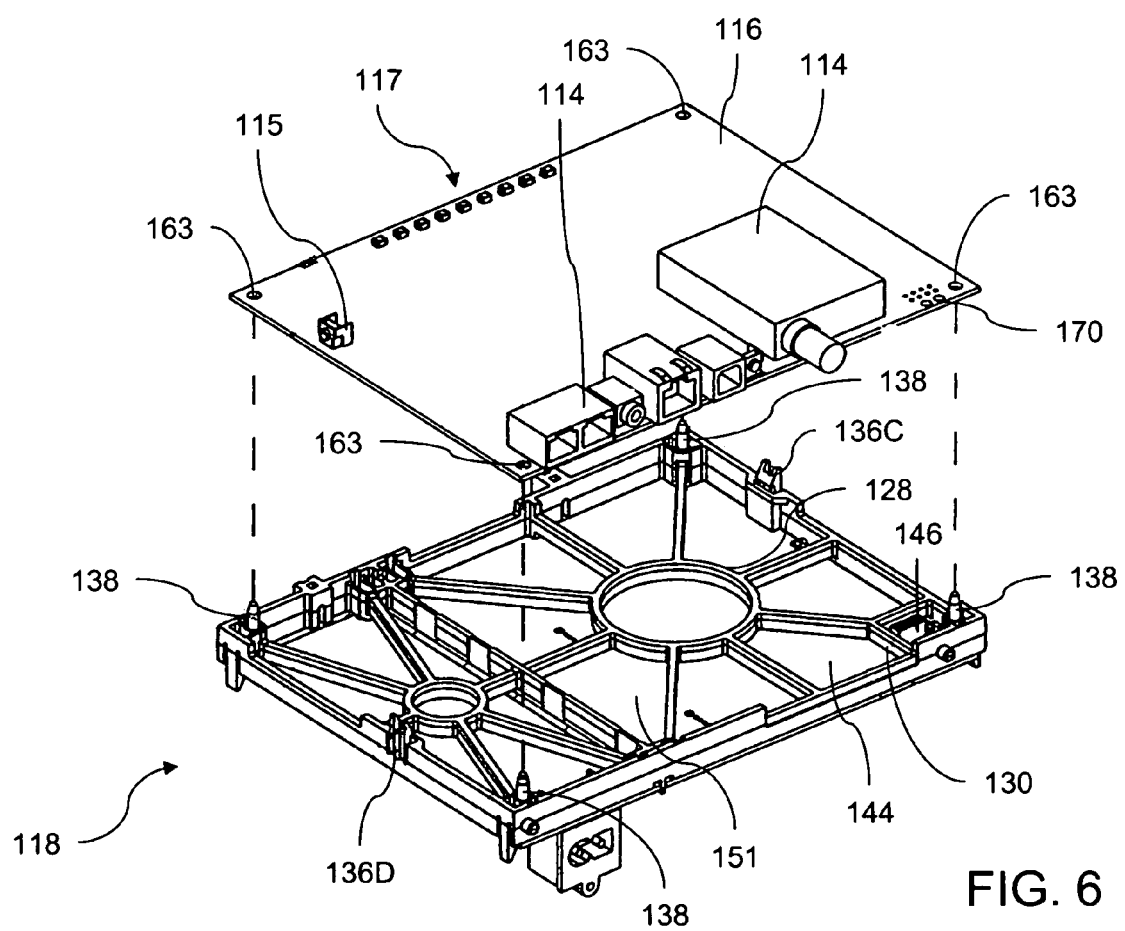
FIG. 6 is a perspective view illustrating installation of a third PWA onto the support structure of FIG. 1 in accordance with one or more aspects of the invention.

FIG. 6 is a perspective view illustrating installation of a third PWA 116 onto the support structure 118 in accordance with one or more aspects of the invention. In FIG. 6, the support structure 118 is shown rotated 180 degrees counter clockwise about an axis parallel to the sides 120, thus exposing the top side of the support structure. For clarity, reference characters for elements of the support structure 118 that are not associated with the PWA 116 are omitted. The PWA 116 includes mounting holes 163 (e.g., four are shown). The support structure 118 includes mounting posts 138. The mounting holes 163 are configured to be registered with the mounting posts 138 such that the PWA 116 is supported within a mounting site 151 defined by the frame of the support structure 118.

To install, the PWA 116 is lowered onto the support structure 118 such that the mounting holes 163 register with the mounting posts 138. The side 122A includes an outer clip 136C, and the side 122B includes an outer clip 136D. In one embodiment, the outer clips 136C and 136D comprise flexible retention clips having a sloped or inclined face upon which the PWA 116 is pressed when mounted. Such pressing causes the outer clips 136C and 136D to flex to allow mounting. Once the PWA 116 is pressed into a level below the inclined face, the outer clips 136C and 136D spring back to the original positions and lock the PWA 116 in position in the mounting site 151. Although only two outer clips 136C and 136D are shown, it is to be understood that more outer clips may be used. Notably, the PWA 116 is secured to the support structure 118 without fasteners, such as screws.

In one embodiment, the PWA 116 comprises a main PWA for a device, such as a VoIP cable modem. The PWA 116 includes various types of components, such as connectors 114, a button 115, light emitting diodes (LEDs) 117, and a connector 170. The connectors 114 and 146 may comprise any type of electrical connectors known in the art. The button 115 may be a power button, reset button, or the like. The LEDs 117 are configured to display various types of information, such as status of the device. When the PWA 116 is installed onto the support structure 118, the connector 170 is disposed in the area 130 defined by the support member 128. In this manner, the connector 170 mates with the connector 146 on the PWA 144. This allows the PWA 116 to be electrically coupled to the PWA 144. Those skilled in the art will appreciate that the PWA 116 may include any number of connectors that can be mated with matching connectors on the PWA 140 and/or the PWA 144. In this manner, the support structure 118 of the invention is configured to enable the alignment and blind mate of one or more connectors between PWAS. That is, the support structure 118 supports PWAs such that a connector on one PWA is aligned with a corresponding connector on another PWA such that the connectors are mated to provide a connection between the PWAS. Since the final connection is obscured, the connection is referred to as a "blind" mate. It is to be understood that the PWA 116 may comprise other types of PWAs for performing other types of functions.

Figure 7:
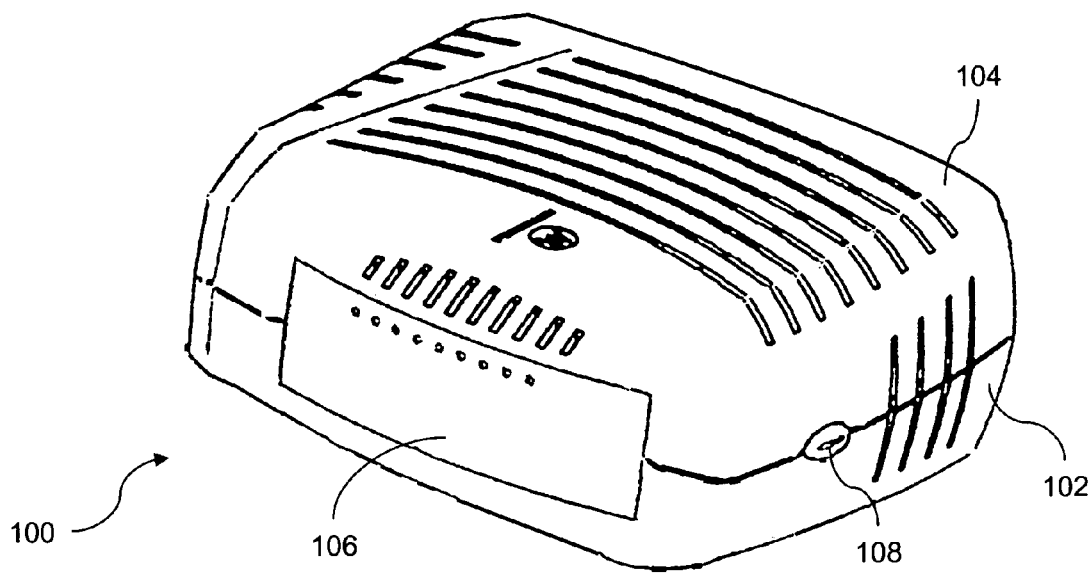
FIG. 7 is a perspective view showing an exemplary embodiment of a housing for a device in which the support structure of FIG. 1 may be enclosed.
Figure 8:
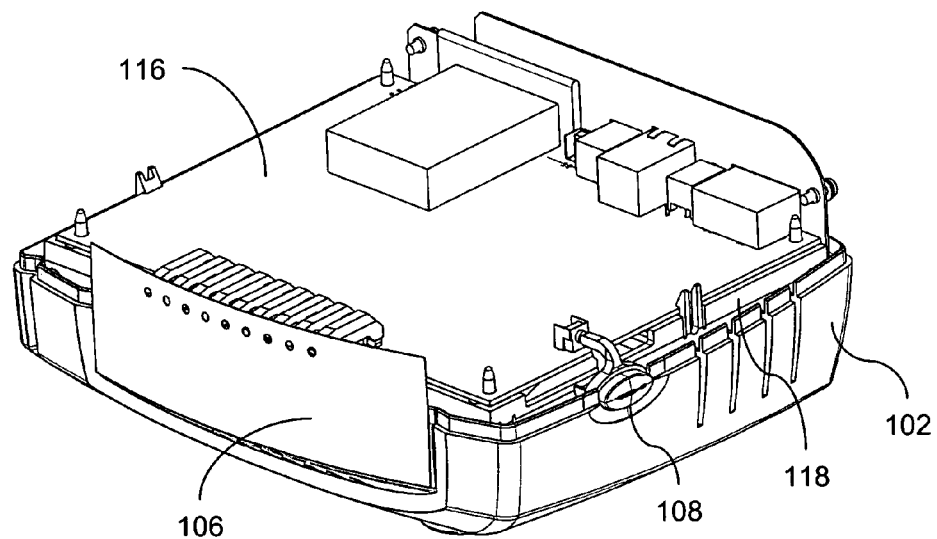
FIG. 8 is a perspective view of the housing with the top portion removed to reveal the support structure of FIG. 1 within.

FIG. 7 is a perspective view showing an exemplary embodiment of a housing 100 for a device. For example, the device may comprise a voice-over internet protocol (VoIP) cable modem. The housing 100 illustratively includes a bottom portion 102 and a top portion 104. FIG. 8 is a perspective view of the housing 100 with the top portion 104 removed. Referring to FIGS. 7–8, the support structure 118 is mounted within the bottom portion 102. The bottom portion 100 includes an indicator panel 106 and a push button 108. The indicator panel 106 is typically transparent or translucent plastic through which the light emitting diodes (LEDs) 117 on the PWA 116 can be viewed. The push button 108 is registered with the button 115 on the PWA 116. The top portion 104 is secured to the bottom portion 104 to enclose the PWAs 116, 140, and 144 therein.

While the foregoing is directed to illustrative embodiments of the present invention, other and further embodiments of the invention may be devised without departing from the basic scope thereof, and the scope thereof is determined by the claims that follow.

What is claimed is:

1. Apparatus for supporting printed wiring assemblies (PWAs) in a device housing, comprising:
   a frame having first opposing sides, second opposing sides, a top side, and a bottom side;
   a lateral member extending between the second opposing sides;
   a plurality of inner clips disposed on the lateral member proximate the bottom side of the frame;
   a first plurality of outer clips disposed on one of the first opposing sides proximate the bottom side of the frame; and
   a second plurality of outer clips disposed on another of the first opposing sides proximate the bottom side of the frame.

2. The apparatus of claim 1, wherein the lateral member, the second opposing sides, and the one of the first opposing sides define a first mounting site for a first PWA, and wherein the lateral member, the second opposing sides, and the other of the first opposing sides define a second mounting site for a second PWA.

3. The apparatus of claim 2, further comprising:
   a first support member within the first mounting site; and
   a second support member within the second mounting site.

4. The apparatus of claim 3, wherein each of the first support member and the second support member comprises:
   a circular portion; and
   a plurality of lateral supports radially extending from the circular portion, each of the plurality of lateral supports joining with the frame or the lateral member.

5. The apparatus of claim 3, further comprising:
   a first set of mounting posts surrounding the first mounting site; and
   a second set of mounting posts surrounding the second mounting site.

6. The apparatus of claim 2, further comprising:
   a third plurality of outer clips formed on the first opposing sides proximate the top side of the frame.

7. The apparatus of claim 6, wherein the top side of the frame defines a third mounting site for a third PWA, the apparatus further comprising:
   a set of mounting posts extending from the frame surrounding the third mounting site.

8. The apparatus of claim 1, wherein the plurality of inner clips comprise fixed retention clips, and wherein the first plurality of outer clips, the second plurality of outer clips, and the third plurality of outer clips each comprise flexible retention clips.

9. Apparatus, comprising:
   a support structure, including:
      a frame having first opposing sides, second opposing sides, a top side, and a bottom side;
      a lateral member extending between the second opposing sides defining a first mounting site and a second mounting site proximate the bottom side;
      a plurality of inner clips disposed on the lateral member proximate the bottom side of the frame;
      a first plurality of outer clips disposed on one of the first opposing sides proximate the bottom side of the frame;
      a second plurality of outer clips disposed on another of the first opposing sides proximate the bottom side of the frame;
      a third plurality of outer clips disposed on the first opposing sides proximate the top side of the frame;
   a first printed wiring assembly (PWA) mounted in the first mounting site via the plurality of inner clips and the first plurality of outer clips;
   a second PWA mounted in the in the second mounting site via the plurality of inner clips and the second plurality of outer clips; and
   a third PWA mounted in a third mounting site proximate the top side of the frame via the third plurality of outer clips.

10. The apparatus of claim 9, further comprising:
    a first support member within the first mounting site; and
    a second support member within the second mounting site.

11. The apparatus of claim 10, wherein each of the first support member and the second support member comprises:
    a circular portion; and
    a plurality of lateral supports radially extending from the circular portion, each of the plurality of lateral supports joining with the frame or the lateral member.

12. The apparatus of claim 10, further comprising:
    a first set of mounting posts surrounding the first mounting site; and
    a second set of mounting posts surrounding the second mounting site;
    wherein the first PWA includes a first set of mounting holes registered with the first set of mounting posts; and
    wherein the second PWA includes a second set of mounting holes registered with the second set of mounting posts.

13. The apparatus of claim 12, further comprising:
    a third set of mounting posts extending from the frame surrounding the third mounting site;
    wherein the third PWA includes a third set of mounting holes registered with the third set of mounting posts.

14. The apparatus of claim 9, further comprising:
at least one first connector disposed on the third PWA;
at least one second connector disposed on at least one of the first PWA and the second PWA, said at least one second connector being respectively mated with the at least one first connector.

15. The apparatus of claim 9, wherein the first PWA comprises a battery charging and monitoring PWA, the second PWA comprises a power supply PWA, and the third PWA comprises a main PWA of an electronic device.

16. The apparatus of claim 9, further comprising:
a housing;
wherein the support structure is mounted within the housing.

17. The apparatus of claim 9, wherein the plurality of inner clips comprise fixed retention clips, and wherein the first plurality of outer clips, the second plurality of outer clips, and the third plurality of outer clips each comprise flexible retention clips.

18. Apparatus for supporting first, second, and third printed wiring assemblies (PWAs) in a device housing, comprising:
a frame having first opposing sides, second opposing sides, a top side, and a bottom side;
a lateral member extending between the second opposing sides;
means for retaining the first and second printed wiring assemblies (PWAs) disposed on the lateral member proximate the bottom side;
means for retaining the first PWA disposed on one of the first opposing sides proximate the bottom side of the frame;
means for retaining the second PWA disposed on another of the first opposing sides proximate the bottom side of the frame; and
means for retaining a third PWA disposed on the first opposing sides proximate the top side of the frame.

19. The apparatus of claim 18, wherein the lateral member, the second opposing sides, and the one of the first opposing sides define a first mounting site for the first PWA, wherein the lateral member, the second opposing sides, and the other of the first opposing sides define a second mounting site for the second PWA, and wherein the top side of the frame defines a third mounting site for a third PWA.

20. The apparatus of claim 19, further comprising:
means for registering the first PWA with the first mounting site;
means for registering the second PWA with the second mounting site; and
means for registering the third PWA with the third mounting site.

* * * * *